(12) United States Patent
Nowak

(10) Patent No.: US 6,995,456 B2
(45) Date of Patent: Feb. 7, 2006

(54) HIGH-PERFORMANCE CMOS SOI DEVICES ON HYBRID CRYSTAL-ORIENTED SUBSTRATES

(75) Inventor: Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/708,586

(22) Filed: Mar. 12, 2004

(65) Prior Publication Data

US 2005/0199984 A1    Sep. 15, 2005

(51) Int. Cl.
H01L 29/04 (2006.01)
H01L 31/036 (2006.01)
H01L 27/01 (2006.01)
H01L 29/00 (2006.01)

(52) U.S. Cl. .................... 257/627; 257/347; 257/527
(58) Field of Classification Search ........ 257/627–628, 257/327–328, 18–19, 527
See application file for complete search history.

(56) References Cited

U.S. PATENT DOCUMENTS

| | | | |
|---|---|---|---|
| 6,657,223 B1 * | 12/2003 | Wang et al. | 257/19 |
| 2004/0195623 A1 * | 10/2004 | Ge et al. | 257/347 |
| 2004/0195646 A1 * | 10/2004 | Yeo et al. | 257/527 |

* cited by examiner

Primary Examiner—Shouxiang Hu
(74) Attorney, Agent, or Firm—Gibb I.P. Law Firm. LLC; William D. Sabo, Esq.

(57) ABSTRACT

Disclosed is an integrated circuit structure that has a substrate having at least two types of crystalline orientations. The first-type transistors are on first portions of the substrate that have a first type of crystalline orientation and second-type transistors are on second portions of the substrate that have a second type of crystalline orientation. The straining layer is above the first-type transistors and the second-type transistors. Further, the straining layer can be strained above the first-type transistors and relaxed above the second-type transistors.

10 Claims, 10 Drawing Sheets

HIGH-PERFORMANCE CMOS SOI DEVICES ON HYBRID CRYSTAL-ORIENTED SUBSTRATES

BACKGROUND OF INVENTION

1. Field of the Invention

The present invention relates to semiconductor devices, and more particularly to integrated semiconductor devices, such as silicon-on-insulator (SOI)/complementary metal oxide semiconductor (CMOS) devices, that are formed on a hybrid crystal oriented substrate. In particular, the present invention provides a means for integrating at least two types of semiconductor devices, such as NFETs and PFETs, onto a bonded substrate having different crystallographic orientations. The location of each device on the bonded substrate is dependent upon the performance of that device has on a particular crystal orientation. For example, the present invention forms NFETs on a (100) surface, while the PFETs are formed on a (110) surface. The (100) crystal surface provides NFETs with high performance, while the (110) crystal surface provides PFETs with high performance.

2. Background of the Invention

In present semiconductor technology, CMOS devices, such as NFETs or PFETs, are typically fabricated upon semiconductor wafers, such as Si, that have a single crystal orientation. In particular, most of today's semiconductor devices are built upon Si having a (100) crystal orientation.

Inversion layer electrons are known to have a high mobility for a (100) Si surface orientation, but inversion layer holes are known to have high mobility for a (110) surface orientation. Furthermore, hole mobility values on (100) Si are roughly 2×–4× lower than the corresponding electron hole mobility for this crystallographic orientation. To compensate for this discrepancy, PFETs are typically designed with larger widths in order to balance pull-up currents against the NFET pull-down currents and achieve uniform circuit switching. NFETs having larger widths are undesirable since they take up a significant amount of chip area.

On the other hand, hole mobilities on (110) Si are 2× higher than on (100) Si; therefore, PFETs formed on a (110) surface will exhibit significantly higher drive currents than PFETs formed on a (100) surface. Unfortunately, electron mobilities on (110) Si surfaces are significantly degraded compared to (100) Si surfaces. The electron mobility degradation on a (110) Si surface is shown, for example, in FIG. 1. In FIG. 1, the solid line represents electron mobility, while the dashed line represents hole mobility.

As can be deduced from the above discussion and FIG. 1, the (110) Si surface is optimal for PFET devices because of excellent hole mobility, yet such a crystal orientation is completely inappropriate for NFET devices. Instead, the (100) Si surface is optimal for NFET devices since that crystal orientation favors electron mobility.

In view of the above, there is a need for providing integrated semiconductor devices that are formed upon a substrate having different crystal orientations that provide optimal performance for a specific device. That is, there is an overwhelming need to create a substrate which allows one type of device, such as, for example, a PFET, to be formed on a certain crystallographic surface, e.g., a (110) surface, while forming another type of device, such as, for example, an NFET, on another crystallographic surface, e.g., a (100) surface.

SUMMARY OF INVENTION

Disclosed is a method of forming an integrated circuit structure that begins by bonding a first substrate structure on a second substrate structure to form a laminated structure. The laminated structure thus has a first substrate with a first crystalline orientation above a second substrate with a second crystalline orientation. The invention etches first openings in the laminated structure down to the second substrate. Then, additional material can be grown from the second substrate to fill the first openings. This produces a substrate at the top of the laminated structure that has first portions having the first type of crystalline orientation and second portions having the second type of crystalline orientation. Further, the first portions of the substrate can comprise non-floating substrate portions and the second portions of the substrate comprise floating substrate portions.

First-type transistors (e.g., N or P type) are formed above the first portions of the substrate and second-type transistors are formed above the second portions of the substrate. The first-type transistors are complementary to the second-type transistors. The first-type transistors and the second-type transistors comprise one of planar complementary metal oxide semiconductor (CMOS) transistors and fin-type field effect transistors (FinFETs). The invention forms a straining layer above the first-type transistors and the second-type transistors.

This produces an integrated circuit structure that has a substrate having at least two types of crystalline orientations. The first-type transistors are on first portions of the substrate that have a first type of crystalline orientation and second-type transistors are on second portions of the substrate that have a second type of crystalline orientation. The straining layer is above the first-type transistors and the second-type transistors. Further, the straining layer can be strained above the first-type transistors and relaxed above the second-type transistors.

The first-type transistors and the second-type transistors include silicide regions and the straining layer is above the silicide regions. The first-type transistors and the second-type transistors include source and drain regions formed within the substrate and a gate conductor formed over the substrate between the source and drain regions and the silicide regions are formed over the gate conductor and the source and drain regions.

Thus, the invention provides a structure that utilizes a type of crystal orientation that benefits N-type transistors for the substrate portions that are below the N-type transistors and a different type of crystal orientation for the substrate portions that are below the P-type transistors that is more beneficial for P-type transistors. This allows each type of transistor to be formed on a different type of substrate with a crystal orientation that benefits each different type of transistor. Further, the invention can selectively include a strain producing layer on either or both types of transistors to allow each of the different types of transistors to be subject to the type straining that is most beneficial to each type of transistor.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF DRAWINGS

The invention will be better understood from the following detailed description with reference to the drawings, in which.

DETAILED DESCRIPTION

Figure 1:
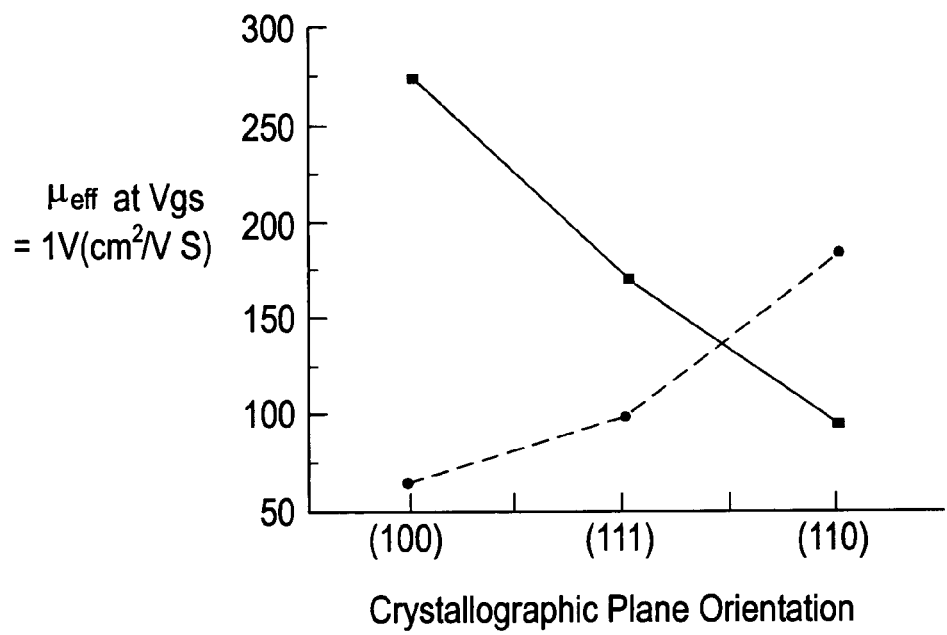
FIG. 1. is a plot of $\mu$eff at Vgs=1V vs. crystallographic orientation for a Si substrate.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

The present invention, which provides a method of forming different semiconductor devices, such as NFETs and PFETS, onto a bonded substrate having different crystallographic surfaces, with strained channel regions, will now be described in greater detail by referring to the following discussion as well as the drawings that accompany the present application. In the accompanying drawings, like and correspondence elements are referred to by like reference numerals.

Figure 2A:
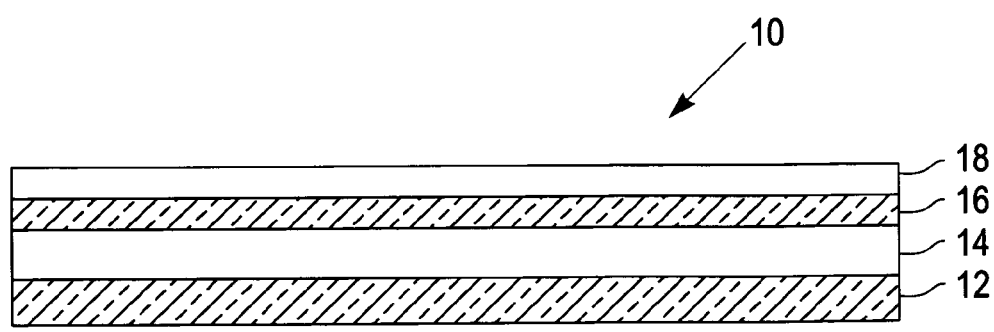
FIGS. 2A–2H are pictorial representations (through cross sectional views) illustrating the basic processing steps utilized in the present invention in forming integrated CMOS devices on different crystallographic orientation planes of a bonded substrate.

FIG. 2A illustrate a bonded substrate 10, i.e., hybrid substrate, which may be employed in the present invention. As shown, bonded substrate 10 includes a surface dielectric layer 18, a first semiconductor layer 16, an insulating layer 14, and a second semiconductor layer 12. The bonded substrate 10 may further include an optional third semiconductor layer (not shown) that is located beneath the second semiconductor layer 12. In the optional bonded substrate, another insulating layer separates the second semiconductor layer 12 from the optional third semiconductor layer.

The surface dielectric layer 18 of the bonded substrate 10 is an oxide, nitride, oxynitride or other insulating layer that is either present in one of the initial wafers before bonding, or formed atop the first semiconductor layer 16 after wafer bonding by either a thermal process (i.e., oxidation, nitridation or oxynitridation) or by deposition. Notwithstanding the origin of the surface dielectric layer 18, the surface dielectric layer 18 has a thickness of from about 3 to about 500 nm, with a thickness of from about 5 to about 20 nm being more highly preferred.

The first semiconductor layer 16 is comprised of any semiconducting material including, for example, Si, SiC, SiGe, SiGeC, Ge alloys, GaAs, InAs, InP as well as other III/V or II/VI compound semiconductors. First semiconductor layer 16 may also comprise an SOI layer of a preformed SOI substrate or a layered semiconductor such as, for example, Si/SiGe. The first semiconductor layer 16 is also characterized as having a first crystallographic orientation, which is preferably (110). Although a (110) crystal orientation is preferred, the first semiconductor layer 16 may have a (111), or a (100) crystal orientation.

The thickness of the first semiconductor layer 16 may vary depending on the initial starting wafers used to form the bonded substrate 10. Typically, however, the first semiconductor layer 16 has a thickness of from about 5 to about 500 nm, with a thickness of from about 5 to about 100 nm being more highly preferred.

The insulating layer 14 which is located between the first semiconductor layer 16 and the second semiconductor layer 12 has a variable thickness depending upon the initial wafers used to create the bonded substrate 10. Typically, however, the insulating layer 14 has a thickness of from about 1 to about 5 nm, with a thickness of from about 5 to about 100 nm being more highly preferred. The insulating layer 14 is an oxide or other like insulator material that is formed on one or both of the wafers prior to bonding.

The second semiconductor layer 12 is comprised of any semiconducting material which may be the same or different from that of the first semiconductor layer 16. Thus, second semiconductor layer 12 may include, for example, Si, SiC, SiGe, SiGeC, Ge alloys, GaAs, InAs, InP as well as other III/V or II/VI compound semiconductors. Second semiconductor layer 12 may also comprise an SOI layer of a preformed SOI substrate or a layered semiconductor such as, for example, Si/SiGe. The second semiconductor layer 12 is also characterized as having a second crystallographic orientation, which is different from the first crystallographic orientation. Since the first semiconductor layer 16 is preferably a (110) surface, the crystallographic orientation of the second semiconductor layer 12 is preferably (100). Although a (100) crystal orientation is preferred, the second semiconductor layer 12 may have a (111), or a (110) crystal structure.

The thickness of the second semiconductor layer 12 may vary depending on the initial starting wafers used to form the bonded substrate 10. Typically, however, the second semiconductor layer 12 has a thickness of from about 5 nm to about 200 nm, with a thickness of from about 5 to about 100 nm being more highly preferred.

When an optional third semiconductor layer is present, the optional third semiconductor layer may comprise the same or different semiconducting material as that of the second semiconductor layer 12. The crystal orientation of the optional third semiconductor layer is typically, but not always, the same as the second semiconductor layer. The optional third semiconductor layer is generally thicker than the second semiconductor layer 12. When the optional third layer is present, an insulating layer separates the optional third semiconductor layer from the second semiconductor layer.

Figure 3A:
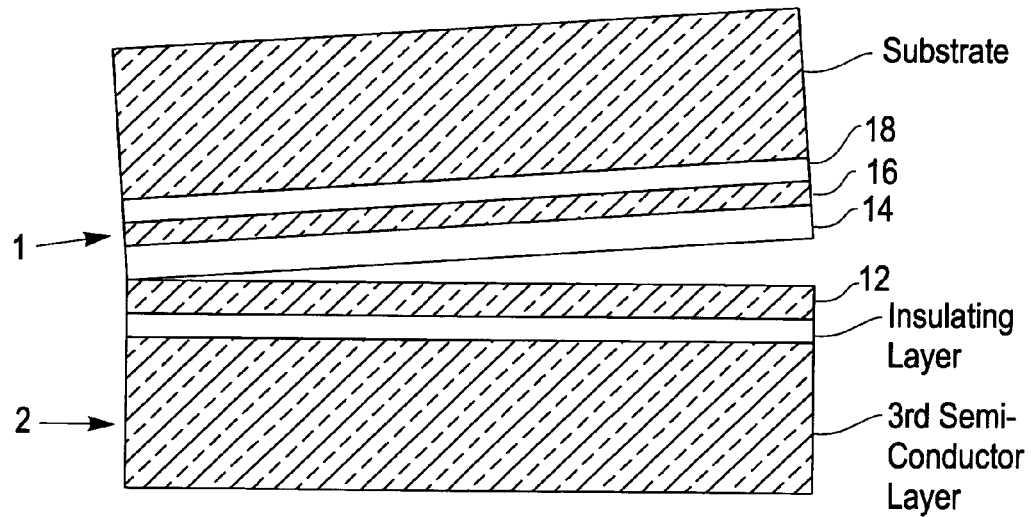
FIGS. 3A–3D are pictorial representations of various wafers that may be bonded together and used in the method described in FIGS. 2A–2E.
Figure 3B:
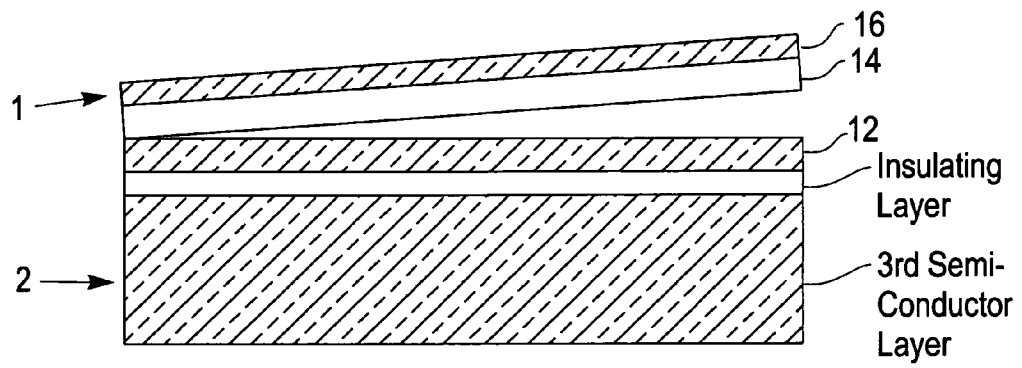
Figure 3C:
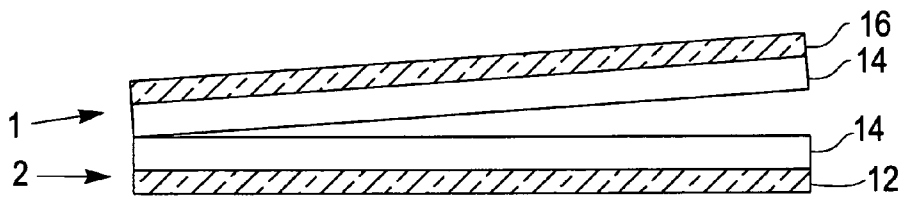
Figure 3D:
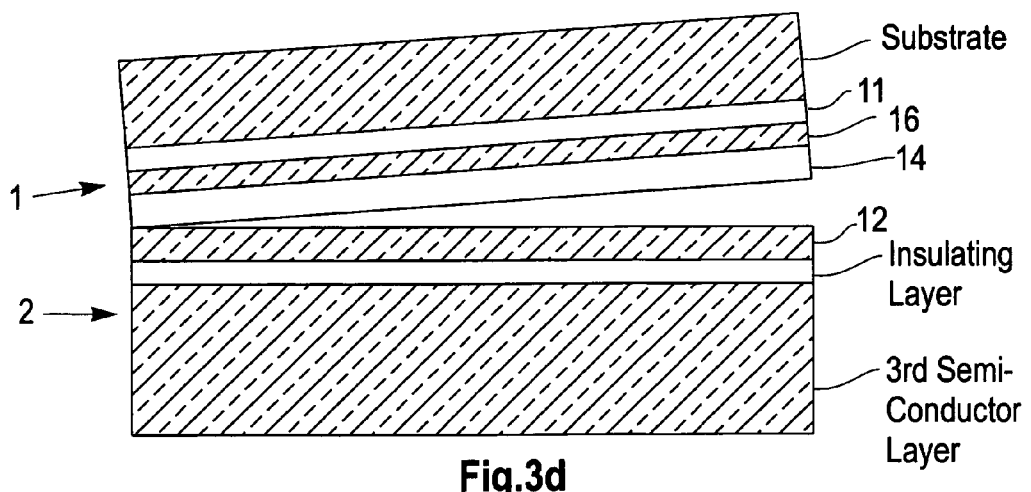

The bonded substrate 10 illustrated in FIG. 2A is comprised of two semiconductor wafers that are bonded together. The two wafers used in fabricating the bonded substrate 10 may include two SOI wafers (See, FIG. 3A), wherein one of the wafers, designated as 1, includes the first semiconductor layer 16 and the other wafer, designated as 2 includes the second semiconductor 12; an SOI wafer (designated as 2) and a bulk semiconductor wafer (designated as 1; see, FIG. 3B); two bulk semiconductor wafers (designated as 1 and 2, respectively; see FIG. 3C) which both contain an insulating layer 14 thereon; or an SOI wafer (designated as 2) and a bulk wafer (designated as 1) which includes an ion implant region 11, such as a H2 implant region, which can be used to split a portion of at least one of the wafers during bonding (See FIG. 3D).

Bonding is achieved by first bringing the two wafers into intimate contact with other; optionally applying an external force to the contacted wafers; and then heating the two contacted wafers under conditions that are capable of bonding the two wafers together. The heating step may be performed in the presence or absence of an external force. The heating step is typically performed in an inert ambient at a temperature of from about 200° to about 1050° C. for a time period of from about 2 to about 20 hours. More preferably, the bonding is performed at a temperature of from about 200° to about 400° C. for a time period of from about 2 to about 20 hours. The term "inert ambient" is used in the present invention to denote an atmosphere in which an inert gas, such as He, Ar, N2, Xe, Kr or a mixture thereof, is employed. A preferred ambient used during the bonding process is N2.

In the embodiment where two SOI wafers are employed, some material layers of at least one of the SOI wafers may be removed after bonding utilizing a planarization process such as chemical mechanical polishing (CMP) or grinding and etching. The planarization process stops when surface dielectric layer 18 is reached.

In the embodiment in which one of the wafers includes an ion implant region, the ion implant region forms a porous region during bonding which causes a portion of the wafer above the ion implant region to break off leaving a bonded wafer such as is shown, for example, in FIG. 1A. The implant region is typically comprised of H2 ions which are implanted into the surface of the wafer utilizing ion implantation conditions that are well known to those skilled in the art.

In the embodiment where the wafers to be bonded do not include a dielectric layer therein, the surface dielectric layer 18 may be formed atop the bonded wafers by a thermal process, such as oxidation, or by a conventional deposition process such as chemical vapor deposition (CVD), plasma-enhanced CVD, atomic layer deposition, chemical solution deposition as well as other like deposition processes.

Figure 2B:
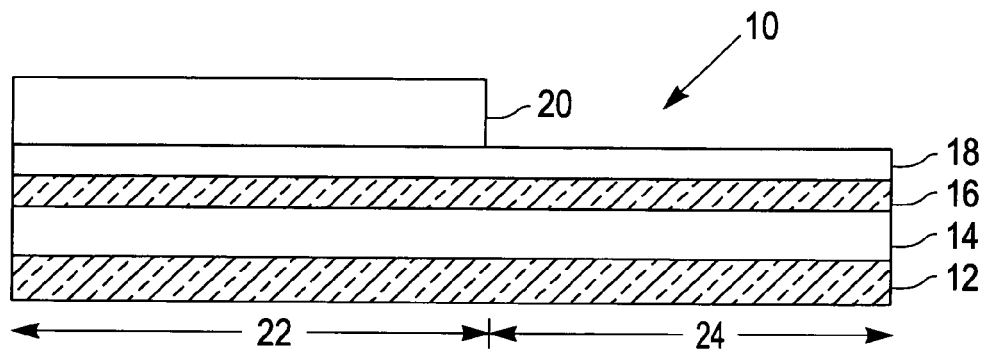

Mask 20 is then formed on a predetermined portion of the bonded substrate 10 of FIG. 2A so as to protect a portion of the bonded substrate 10, while leaving another portion of the bonded substrate 10 unprotected. The protected portion of the bonded substrate 10 defines a first device region 22 of the structure, whereas the unprotected portion of the bonded substrate 10 defines a second device area 24. In one embodiment, mask 20 is formed on a predetermined portion of the surface dielectric layer 18 by applying a photoresist mask to the entire surface of the bonded substrate 10. After application of the photoresist mask, the mask is patterned by lithography, which includes the steps of exposing the photoresist to a pattern of radiation and developing the pattern utilizing a resist developer. The resultant structure including the mask 20 formed on a predetermined portion of the bonded substrate 10 is shown, for example, in FIG. 2B.

In another embodiment mask 20 is a nitride or oxynitride layer that is formed and patterned utilizing lithography and etching. The nitride or oxynitride mask 20 may be removed after defining the region for the second semiconductor device.

After providing the mask 20 to the bonded substrate 10, the structure is subjected to one or more etching steps so as to expose a surface of the second semiconductor layer 12. Specifically, the one or more etching steps used at this point of the present invention removes the unprotected portions of the surface dielectric layer 18, as well as underlying portions of the first semiconductor layer 16, and a portion of the insulating layer 14 which separated the first semiconductor layer 16 from the second semiconductor layer 12. The etching may be performed utilizing a single etching process or multiple etching steps may be employed. The etching used at this point of the present invention may include a dry etching process such as reactive-ion etching, ion beam etching, plasma etching or laser etching, a wet etching process wherein a chemical etchant is employed or any combination thereof. In a preferred embodiment of the present invention, reactive-ion etching (RIE) is used in selectively removing the unprotected portions of the surface dielectric layer 18, the first semiconductor layer 16 and the insulating layer 14 in the second semiconductor device region 24. The resultant structure after the etching process has been performed is shown, for example, in FIG. 2C. Note that the sidewalls of the protected first device region 22, i.e., the surface dielectric layer 18, the first semiconductor layer 16, the insulating layer 14 and the second semiconductor layer 12, are exposed after this etching step. As shown, the exposed sidewalls of layers 18, 16 and 14 are aligned with an outer most edge of mask 20.

Figure 2C:
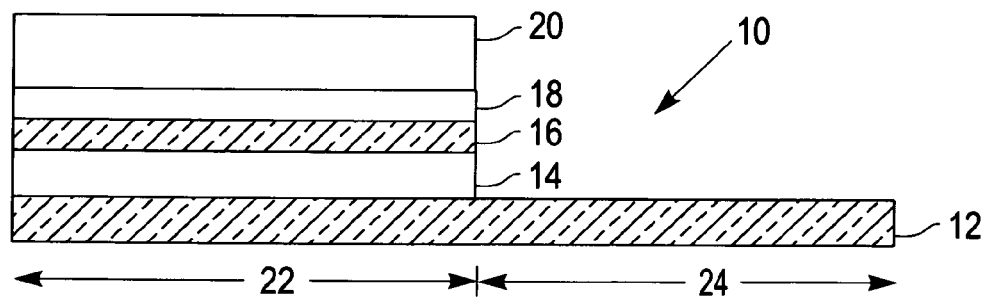

The mask 20 is then removed from the structure shown in FIG. 2C utilizing a conventional resist stripping process and then a liner or spacer 25 is formed on the exposed sidewalls. The liner or spacer 25 is formed by deposition and etching. The liner or spacer 25 is comprised of an insulating material such as, for example, an oxide.

After forming the liner or spacer 25, a semiconductor material 26 is formed on the exposed second semiconductor layer 12. In accordance with the present invention, semiconductor material 26 has a crystallographic orientation that is the same as the crystallographic orientation of the second semiconductor layer 12. The resultant structure is shown, for example, in FIG. 2D.

The semiconductor material 26 may comprise any Si-containing semiconductor, such as Si, strained Si, SiGe, SiC, SiGeC or combinations thereof, which is capable of being formed utilizing a selective epitaxial growth method. In some preferred embodiments, semiconductor material 26 is comprised of Si. In other preferred embodiments, the semiconductor material is a strained Si layer that is located atop a relaxed SiGe alloy layer. In the present invention, semiconductor material 26 may be referred to as a regrown semiconductor material.

Figure 2D:
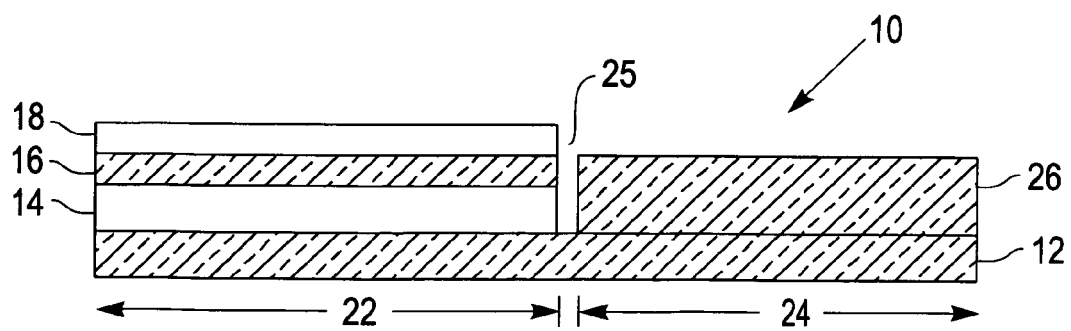

Next, the structure shown in FIG. 2D is subjected to a planarization process such as chemical mechanical polishing (CMP) or grinding such that the upper surface of the semiconductor material 26 is substantially planar with the upper surface of the first semiconductor layer 16. Note that previously protected portion of surface dielectric layer 18 is removed during this planarization process.

After providing the substantially planar surfaces, an isolation region 27, such as a shallow trench isolation region, is typically formed so as to isolate the first semiconductor device region 22 from the second semiconductor device region 24. The isolation region 27 is formed utilizing processing steps that are well known to those skilled in the art including, for example, trench definition and etching; optionally lining the trench with a diffusion barrier; and filling the trench with a trench dielectric such as an oxide. After the trench fill, the structure may be planarized and an optional densification process step may be performed to densify the trench dielectric.

Figure 2E:
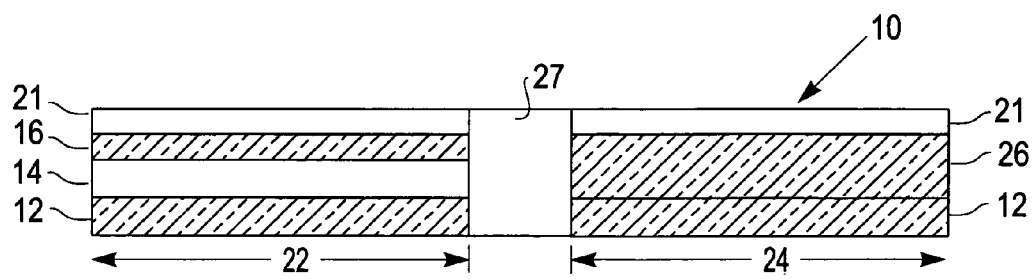

The resultant substantially planar structure containing isolation region 27 is shown, for example, in FIG. 2E. As shown, the structure of FIG. 2E includes an exposed first semiconductor layer 16 of a first crystal orientation and an unexposed regrown semiconductor material 26 that has the same crystal orientation as that of the second semiconductor layer 12.

Additionally, FIG. 2E illustrates an optional epitaxially grown semiconductor layer 21 that is formed over the different types of substrates 16, 26. This layer may include, for example, silicon or a bilayer of silicon-germanium alloy with silicon above.

While the figures illustrate the grown semiconductor layer 21 being formed over both types of substrate 16, 26, the invention can also mask one type of substrate when forming the semiconductor layer to only modify one of the types of substrates.

Figure 2F:
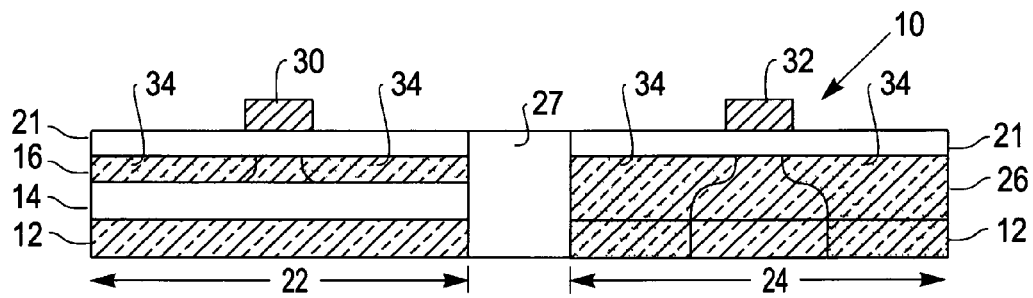

FIG. 2F shows the integrated structure that is formed after a first semiconductor device 30 is formed on a portion of the first semiconductor layer 16 and a second semiconductor device 32 is formed on the regrown semiconductor material 26. Despite showing the presence of only one semiconductor device in each device region, the present invention contemplates forming a plurality of each type of device in the specific device region. In accordance with the present invention, the first semiconductor device may be a PFET or a NFET, whereas the second semiconductor device may be a NFET or PFET, with the proviso that the first semiconductor device is different from the second semiconductor device and that the specific device is fabricating on a crystal orientation that provides a high performance device. The PFETs and NFETs are formed utilizing standard CMOS processing steps that are well known to those skilled in the art. Each FET includes a gate dielectric, a gate conductor, an optional hard mask located atop the gate conductor, spacers located on sidewalls of at least the gate conductor, and source/drain diffusion regions. The diffusion regions are labeled as 34 in FIG. 2F. Note that the PFET is formed over the semiconductor material that has a (110), or (111) orientation, whereas the NFET is formed over a semiconductor surface having a (100), or (111) orientation.

Figure 2G:
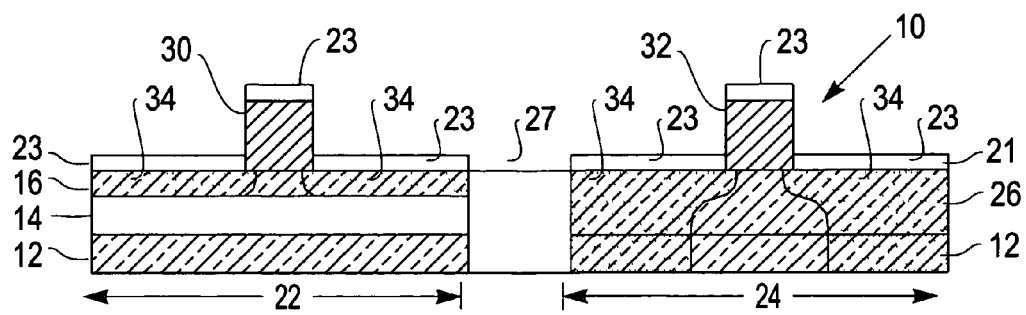
Figure 2H:
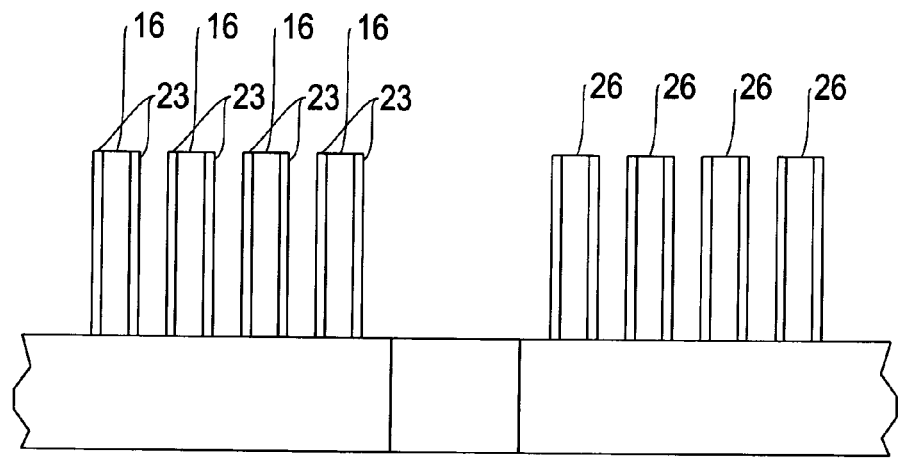

FIG. 2G illustrates straining layer 23, formed after the source/drain and gate of the transistors are formed. Straining layer 23 is formed after the source/drain regions 34 and gate conductor 32 are silicided. This embodiment is especially useful with fin-type transistors (FinFETs) as shown in FIG. 2H. More specifically, with FinFETs, the fins are formed from the different silicon substrates 16, 26 and the straining layer 23 is formed after the fins are silicided.

The above description and FIGS. 2A–2H illustrate the basic concept of the present invention which includes providing a bonded substrate having two different crystallographic orientations, masking, etching, regrowth, planarization and device formation. The following description with references to FIGS. 4A–4J illustrate processing steps used in forming a high performance semiconductor device containing two NFETs formed on a (100) crystallographic surface, and a PFET, which is located between the NFETs, formed on a (110) crystallographic surface.

Figure 4A:
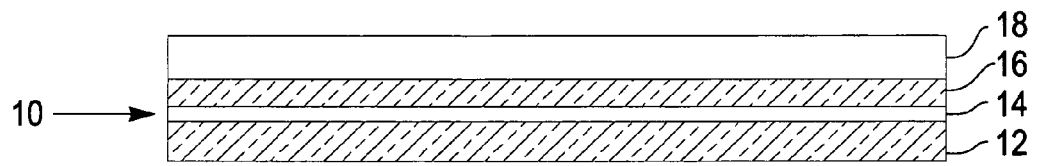
FIGS. 4A–4J are pictorial representations (through cross sectional views) illustrating the basic processing steps used in forming a high performance semiconductor device containing two NFETs formed on a (100) crystallographic surface, and a PFET, which is located between the NFETs, formed on a (110) crystallographic surface.

FIG. 4A illustrates a bonded substrate 10 that may be used in this embodiment of the present invention. The bonded substrate 10 includes a surface dielectric layer 18, a first semiconductor layer 16, an insulating layer 14 and a second semiconductor layer 12. A third optional semiconductor layer may be located beneath the second semiconductor layer 12. In such an embodiment, an insulating layer separates the second semiconductor layer from the optional third semiconductor layer.

Figure 4B:
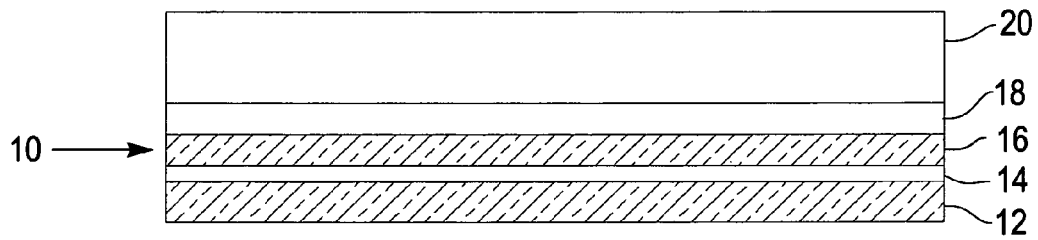

FIG. 4B illustrates the structure after nitride mask 20 has been formed on the surface dielectric layer 18. The nitride mask 20 is formed utilizing a conventional deposition process such as CVD.

Figure 4C:
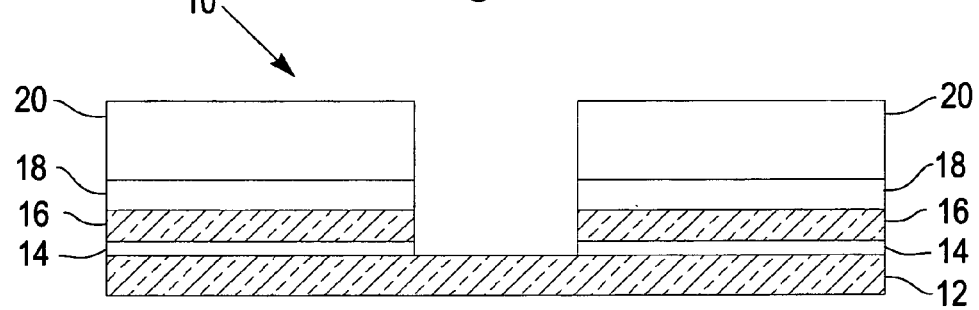

After formation of nitride mask 20, the mask is patterned utilizing a patterned photoresist mask and etching, and then the pattern is transferred via another etching process from nitride mask 20 into the structure stopping atop an upper surface layer of the second semiconductor layer 12. The etching used in the second etching removes portions of the surface dielectric layer 18, the first semiconductor layer 16, and the insulating layer 14. A single or multiple etching process is performed in transferring the pattern into the bonded substrate 10. FIG. 4C shows the resultant structure after pattern transfer.

Figure 4D:
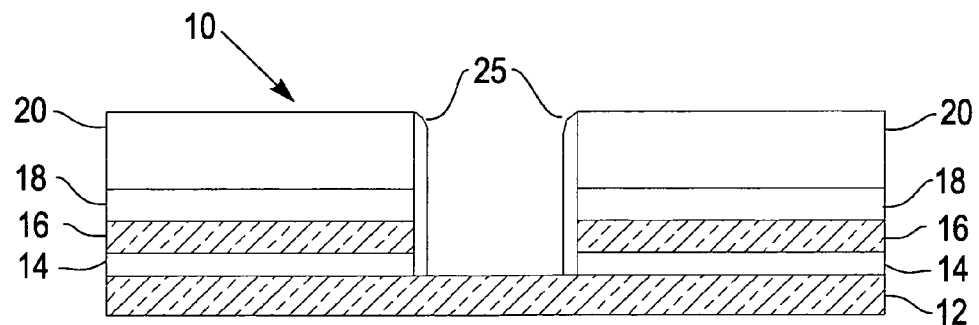

Next, and as shown in FIG. 4D, spacers 25 are formed on the exposed sidewalls. The spacers 25 are composed of an insulating material including, for example, an oxide. The spacers 25 which are located on the sidewalls of the protected first device region are formed by deposition and etching.

Figure 4E:
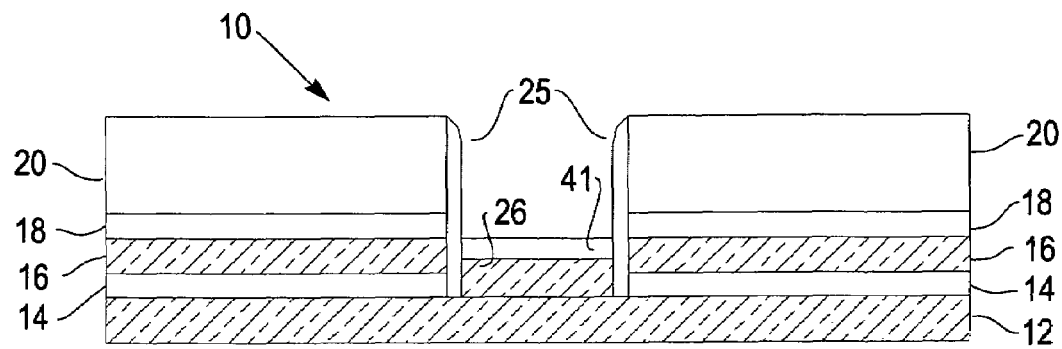

After formation of the spacers 25, semiconductor material 26 is formed on the exposed surface of the second semiconductor layer 12 providing the structure shown, for example, in FIG. 4E. As with the straining layer 23 discussed above, a straining layer 41 can also be utilized with this embodiment. The properties of both straining layers would be similar. The structure illustrated in FIG. 4E is then planarized to provide the substantially planer structure shown in FIG. 4F. Note that the planarization step removes the nitride mask 20 and the surface dielectric layer 18 that were not previously etched so as to provide a structure in which first semiconductor layer 16 is exposed and regrown semiconductor material 26 is exposed. The exposed first semiconductor layer 16 is the region in which a first semiconductor device such as an NFET will be formed, whereas the exposed surface of semiconductor material 26 is the region in which a second semiconductor device, such as a PFET, will be formed.

Figure 4F:
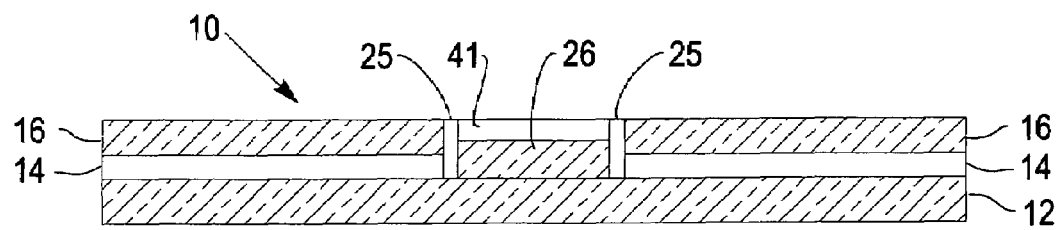
Figure 4G:
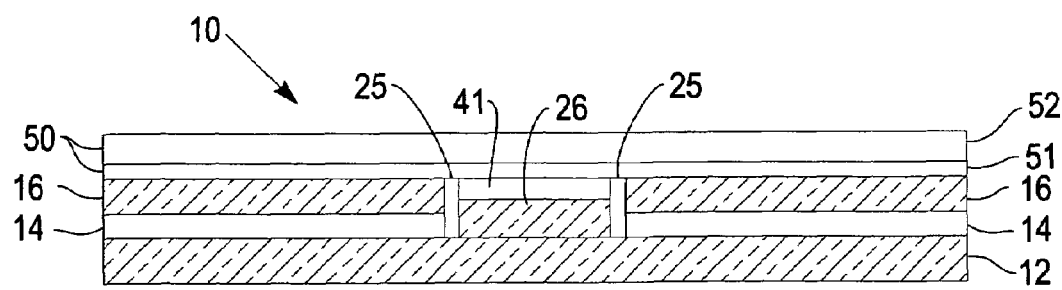
Figure 4H:
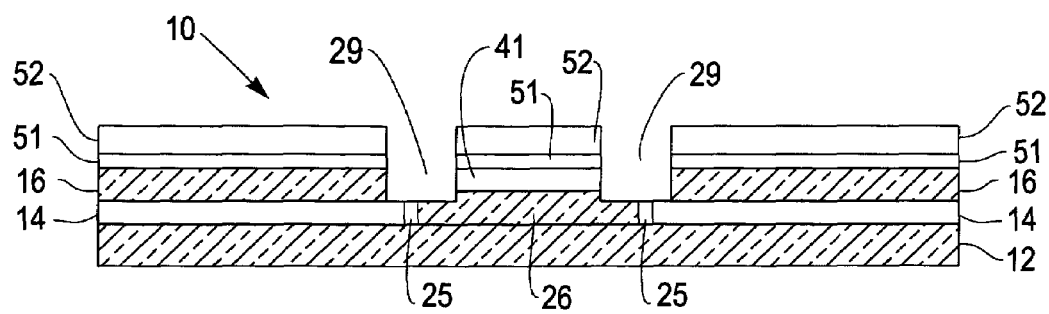

Next, and as shown in FIG. 4G, a material stack 50 comprising a pad oxide 51 and a pad nitride 52 is then formed atop the substantially planar structure shown in FIG. 4F. The pad oxide 51 of the material stack 50 is formed by either a thermal oxidation process or by deposition, while the pad nitride 52 is formed by a thermal nitridation process or deposition. The pad nitride 52 is typically thicker than the underlying pad oxide 51. The material stack 50 is used in defining the trench openings for isolation regions 27. FIG. 4H illustrates the structure that is formed after trench openings 29 have been formed into the structure shown in FIG. 4G. The trench openings 29 are formed by lithography and etching.

Figure 4I:
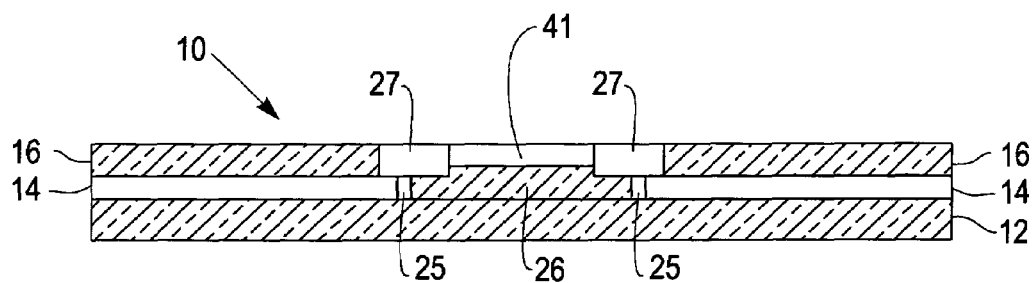

After defining the trench openings 29, the trench openings 29 are filled with a trench dielectric such as an oxide and planarized to the first semiconductor layer 16 and the regrown semiconductor material 26. FIG. 4I shows the structure that is formed after trench filling and planarization. The structure shown in FIG. 4I includes three device regions; two of which are referred to as first device regions 22 in which a first semiconductor device 30 will be formed and the third is a second device region 24 in which a second semiconductor device 32 will be formed.

Figure 4J:
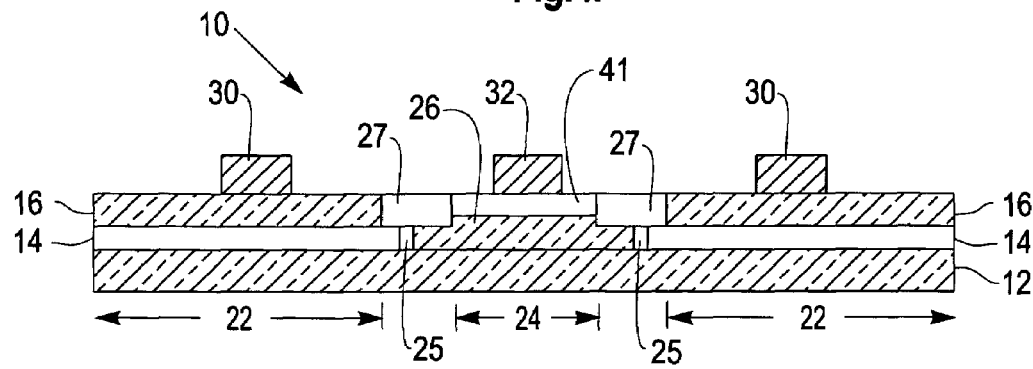

FIG. 4J shows the integrated structure that is formed after a first semiconductor device 30 is formed on a portion of the first semiconductor layer 16 and a second semiconductor device 32 is formed on the regrown semiconductor material 26. Despite showing the presence of only one semiconductor device in each device region, the present invention contemplates forming a plurality of each type of device in the specific device region. In accordance with the present invention, the first semiconductor device may be a PFET (or NFET), whereas the second semiconductor device may be a NFET (or PFET). The PFETs and NFETs are formed utilizing standard CMOS processing steps that are well known to those skilled in the art. Each FET includes a gate dielectric, a gate conductor, an optional hard mask located atop the gate conductor, spacers located on sidewalls of at least the gate conductor, source/drain diffusion regions. Note that the PFET is formed over a surface having a (110) or (111) orientation, whereas the NFET is formed over a surface having a (100) or (111) orientation. In the structure shown in FIG. 4J, the NFETs are SOI-like devices, whereas the PFET is a bulk-like semiconductor device. If a third semiconductor layer was present beneath the second semiconductor layer 12, all three devices would be SOI-like.

FIGS. 5A–5F illustrates alternative processing steps used in forming a high performance semiconductor device containing two NFETs formed on a (100) crystallographic surface, and a PFET, which is located between the NFETs, formed on a (110) crystallographic surface. The alternative method begins with forming the bonded substrate shown in FIG. 5A. The bonded substrate 10 includes at least a surface dielectric layer 18, a first semiconductor layer 16, an insulating layer 14 and a second semiconductor layer 12. A third optional semiconductor layer may be located beneath the second semiconductor layer.

Figure 5A:
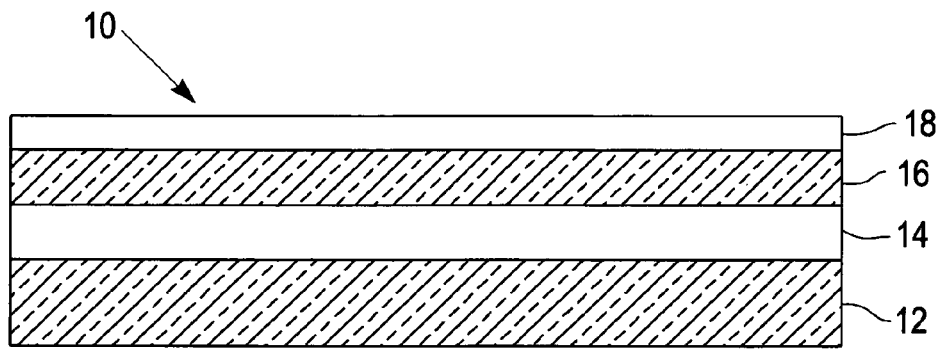
FIGS. 5A–5F are pictorial representations (through cross sectional views) illustrating alternative processing steps used in forming a high performance semiconductor device containing two NFETs formed on a (100) crystallographic surface, and a PFET, which is located between the NFETs, formed on a (110) crystallographic surface.
Figure 5B:
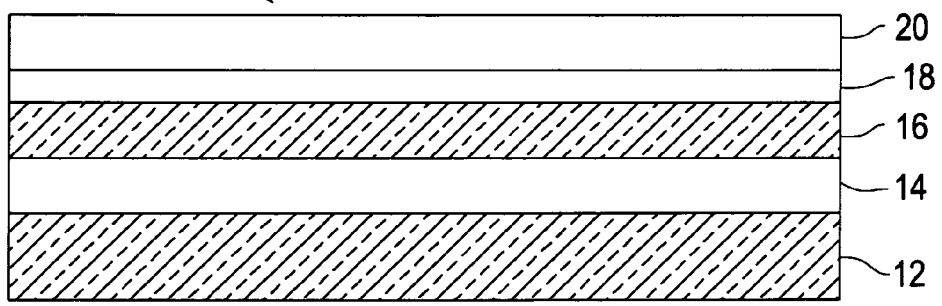
Figure 5C:
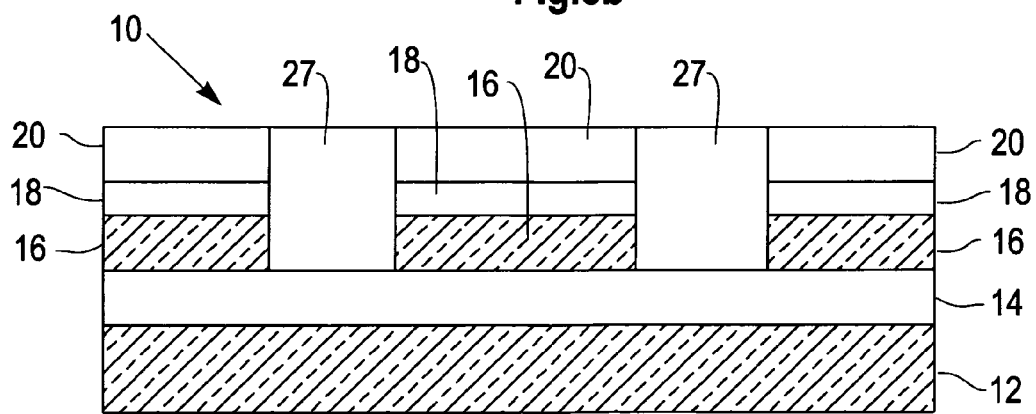

Next, nitride mask 20 is formed on the bonded substrate 10 to provide the structure illustrated in FIG. 5B. After forming the nitride mask 20 on the bonded substrate 10, isolation regions 27 are formed utilizing the nitride mask 20 and surface dielectric 18 as a combined etch mask. Isolation regions 27 are formed by applying a photoresist to the surface of the nitride mask 20, patterning the photoresist and transferring the pattern from the photoresist into the nitride mask 20 and then into the surface dielectric layer 18 to expose the first semiconductor layer 16. The exposed first semiconductor layer 16 is then etched stopping on an upper surface of the insulating layer 14. The trenches formed by the etching step are then filled with a trench dielectric and planarized to an upper surface of the nitride mask 20. FIG. 5C shows the structure after trench fill and planarization. In particular, isolation regions 27 are shown in FIG. 5C.

Figure 5D:
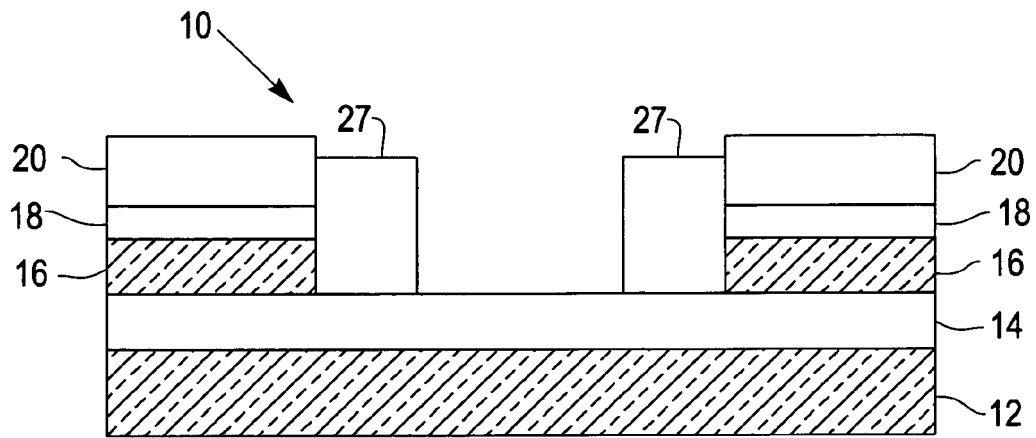

The material between the isolation regions is then removed providing the structure shown in FIG. 5D. Specifically, the material between the isolation regions is removed by forming a block mask to protect portions of the structure in which the first semiconductor devices will be formed and then etching the unprotected portions of the nitride mask 20, the surface dielectric layer 18 and the first semiconductor layer 16 stopping on the insulating layer 14.

Figure 5E:
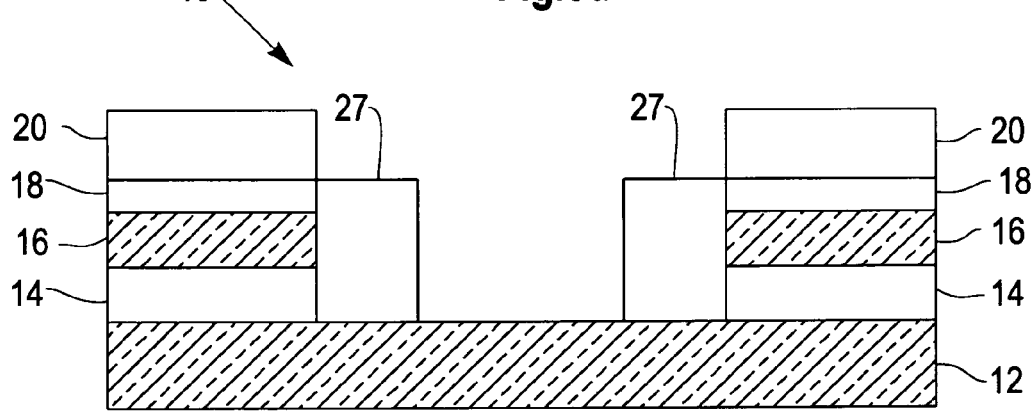

The exposed portion of the insulating layer 14 is then removed utilizing an etching process that selectively removes an insulator material, such as an oxide, providing the structure shown, for example, in FIG. 5E. Note that this etching step also reduces the height of isolation regions 27. This etching step stops atop an upper surface of the second semiconductor layer 12. The remaining nitride mask 20 is then stripped from the structure and then semiconductor material 26 is regrown on the exposed surface of the second semiconductor material 12 providing the structure shown, for example, in FIG. 5F. In this particular embodiment, the regrown semiconductor material 26 includes an upper layer of strained Si 31.

Figure 5F:
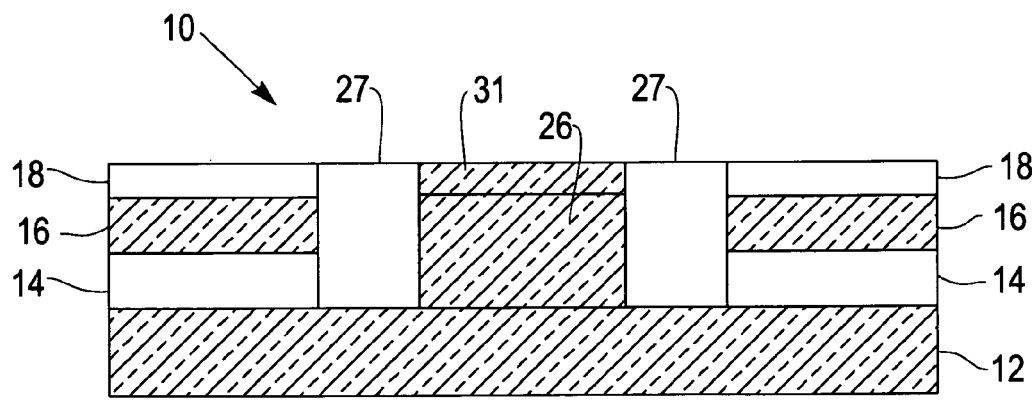

Oxide is then stripped from the structure shown in FIG. 5F and strained Si 31 is formed on the exposed portions of the first semiconductor layer 16. After forming the strained Si layers, CMOS devices 30 and 32 are formed over the respective crystal orientation that provides a high performance device.

Thus, as shown above, the invention provides a method of forming an integrated circuit structure that begins by bonding a first substrate structure on a second substrate structure to form a laminated structure. The invention etches first openings in the laminated structure down to the second substrate. Then, additional material can be grown from the second substrate to fill the first openings. This produces a substrate at the top of the laminated structure that has first portions having the first type of crystalline orientation and second portions having the second type of crystalline orientation. First-type transistors (e.g., N or P type) are formed above the first portions of the substrate and second-type transistors are formed above the second portions of the substrate. The invention forms a straining layer above the first-type transistors and the second-type transistors.

This produces an integrated circuit structure that has a substrate having at least two types of crystalline orientations. The first-type transistors are on first portions of the substrate that have a first type of crystalline orientation and second-type transistors are on second portions of the substrate that have a second type of crystalline orientation. The straining layer is above the first-type transistors and the second-type transistors. Further, the straining layer can be strained above the first-type transistors and relaxed above the second-type transistors.

The first-type transistors and the second-type transistors include silicide regions and the straining layer is above the silicide regions. The first-type transistors and the second-type transistors include source and drain regions formed within the substrate and a gate conductor formed over the substrate between the source and drain regions, and the silicide regions are formed over the gate conductor and the source and drain regions.

Thus, the invention provides a structure that utilizes a type of crystal orientation that benefits N-type transistors for the substrate portions that are below the N-type transistors and a different type of crystal orientation for the substrate portions that are below the P-type transistors that is more beneficial for P-type transistors. This allows each type of transistor to be formed on a different type of substrate with a crystal orientation that benefits each different type of transistor. Further, the invention can selectively include a strain producing layer on either or both types of transistors to allow each of the different types of transistors to be subject to the type straining that is most beneficial to each type of transistor.

This invention provides for higher mobility carriers in nFETs and in pFETs which results in increased switching speed for CMOS circuits, and/or in lower power operation. Increased linearity of these FETs also provides advantages in analog circuits employing such devices.

While the invention has been described in terms of preferred embodiments, those skilled in the art will recognize that the invention can be practiced with modification within the spirit and scope of the appended claims.

What is claimed is:

1. An integrated circuit structure comprising:
   a substrate having at least two types of crystalline orientations;
   first-type transistors formed on first portions of said substrate having a first type of crystalline orientation;
   second-type transistors formed on second portions of said substrate having a second type of crystalline orientation different from the first type of crystalline orientation; and
   a straining layer above said first-type transistors and said second-type transistors,
   wherein said first portions of said substrate comprise a first layer at a top of said first portions, said first layer having said first type of crystalline orientation and a second layer at a bottom of said first portions, said second layer having said second type of crystalline orientation, and
   wherein said second portions of said substrate comprise said second layer at a bottom of said second portions and a third layer at a top of said second portions, said third layer having said second type of crystalline orientation and said third layer contacting said second layer;
   wherein said first-type transistors and said second-type transistors include silicide regions and said straining layer is above said silicide regions; and,
   wherein said integrated circuit structure further comprises an insulator layer separating said first layer from said second layer.

2. The structure in claim 1, wherein each of said first-type transistors and said second-type transistors include source and drain regions formed within said substrate and a gate conductor formed over said substrate between said source and drain regions, and
   wherein said silicide regions are formed over said gate conductor and said source and drain regions.

3. The structure in claim 1, wherein said first-type transistors are complementary to said second-type transistors.

4. The structure in claim 1, wherein said second portions of said substrate comprise non-floating substrate portions and said first portions of said substrate comprise floating substrate portions.

5. The structure in claim 1, wherein said first-type transistors and said second-type transistors comprise one of planar complementary metal oxide semiconductor (CMOS) transistors and fin-type field effect transistors (FinFETs).

6. An integrated circuit structure comprising:
   a substrate having at least two types of crystalline orientations;
   N-type field effect transistors (NFETs) formed on first portions of said substrate having a first type of crystalline orientation;
   P-type field effect transistors (PFETs) formed on second portions of said substrate having a second type of crystalline orientation different from the first type of crystalline orientation; and
   a straining layer above said NFETs and said PFETs,
   wherein one of said first portions and said second portions of said substrate comprise a first layer at a top, said first layer having said first type of crystalline orientation and a second layer at a bottom, said second layer having said second type of crystalline orientation, and
   wherein the other of said first portions and said second portions of said substrate comprise said second layer at a bottom and a third layer at a top, said third layer having said second type of crystalline orientation and said third layer contacting said second layer;
   wherein said NFETs and said PFETs include silicide regions and said straining layer is above said silicide regions; and,
   wherein said integrated circuit structure further comprises an insulator layer separating said first layer from said second layer.

7. The structure in claim 6, wherein each of said NFETs and said PFETs include source and drain regions formed within said substrate and a gate conductor formed over said substrate between said source and drain regions, and
   wherein said silicide regions are formed over said gate conductor and said source and drain regions.

8. The structure in claim 6, wherein said NFETs are complementary to said PFETs.

9. The structure in claim 6, wherein one of said first portions and said second portions of said substrate comprise non-floating substrate portions and the other of said first portions and said second portions of said substrate comprise floating substrate portions.

10. The structure in claim 6, wherein said NFETs and said PFETs comprise one of planar complementary metal oxide semiconductor (CMOS) transistors and fin-type field effect transistors (FinFETs).

* * * * *